United States Patent [19]
Ohta

[11] Patent Number: 5,815,444
[45] Date of Patent: Sep. 29, 1998

[54] SERIAL ACCESS SYSTEM SEMICONDUCTOR STORAGE DEVICE CAPABLE OF REDUCING ACCESS TIME AND CONSUMPTION CURRENT

[75] Inventor: Yoshiji Ohta, Kashiwara, Japan

[73] Assignee: Sharp Kabushiki Kaisha, Osaka, Japan

[21] Appl. No.: 995,272

[22] Filed: Dec. 19, 1997

[30] Foreign Application Priority Data

Dec. 27, 1996 [JP] Japan ................................. 8-349350

[51] Int. Cl.$^6$ ............................... G11C 7/00; G11C 8/00; G11C 11/34

[52] U.S. Cl. ................. 365/189.05; 365/189.12; 365/221; 365/230.08; 365/185.21

[58] Field of Search ................ 365/189.05, 189.12, 365/221, 230.08, 185.21

[56] References Cited

U.S. PATENT DOCUMENTS

| | | | |
|---|---|---|---|
| 4,796,231 | 1/1989 | Pinkham | 365/189.12 |
| 5,530,670 | 6/1996 | Matsumoto | 365/189.12 |
| 5,539,680 | 7/1996 | Aoki | 365/185.21 |

*Primary Examiner*—David C. Nelms
*Assistant Examiner*—Trong Phan
*Attorney, Agent, or Firm*—Morrison & Foerster, LLP

[57] ABSTRACT

There is provided a serial access system semiconductor storage device capable of reducing access time and decreasing consumption current. A memory cell array including a plurality of memory cells and shift registers and having a plurality of latch circuits connected in series are provided. The shift registers once hold data, received from the memory cell array 1 via a bit line in a read operation, in the latch circuits and serially output the held data in the order in which the latch circuits are arranged. The latch circuits sense-amplify the data stored in the memory cells inside the memory cell array.

4 Claims, 7 Drawing Sheets

SERIAL ACCESS SYSTEM SEMICONDUCTOR STORAGE DEVICE CAPABLE OF REDUCING ACCESS TIME AND CONSUMPTION CURRENT

BACKGROUND OF THE INVENTION

The present invention relates to a serial access system semiconductor storage device.

Figure 11:
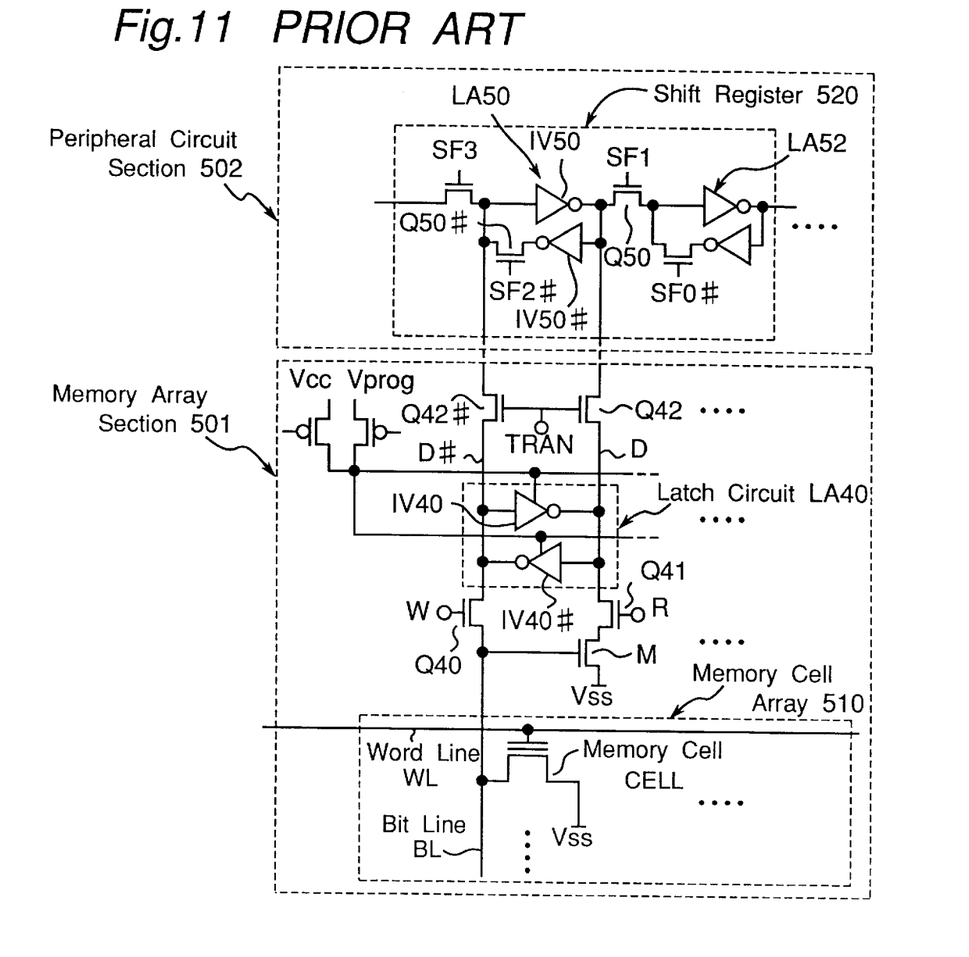
FIG. 11 is a diagram showing constitution of a prior art flash memory.

As shown in FIG. 11, a prior art serial access system flash memory (electrically collectively erasable programmable read-only memory) is provided with a memory array section 501 and a peripheral circuit section 502. The memory array section 501 includes a memory cell array 510 in which a plurality of memory cells (floating-gate type transistors) CELL are arranged in a matrix form and a latch circuit LA40 constructed of two inverters IV40 and IV40# which are connected reversely to each other between data lines D and D#. The peripheral circuit section 502 includes a shift register 520 having a plurality of latch circuits LA50, LA52, . . . Each of the latch circuits LA50, LA52, . . . has a CMOS inverter IV50, a CMOS inverter IV50# and an NMOS transistor Q50# which are connected in a loop form. The latch circuits LA50, LA52, . . . are connected in series via an NMOS transistor Q50. The NMOS transistors Q50 and Q50# are controlled to be turned on and off by shift register control signals SF1, SF3, . . . , SF0#, SF2#, In a read operation, a read control signal R is made to have H-level to turn on an NMOS transistor Q41 and select a word line WL connected to the memory cell CELL to be read. A change in the gate voltage of the NMOS transistor M is detected depending on whether or not a current has flowed from a bit line BL to the ground Vss via the memory cell CELL (depending on the storage contents (data) of the memory cell CELL, i.e., a threshold voltage Vth of the floating-gate type transistor), and the result is once stored in the latch circuit LA40. Subsequently, a transfer signal TRAN is made to have H-level to turn on NMOS transistors Q42 and Q42# and transfer the data stored in the latch circuit LA40 to the latch circuit LA50 of the shift register 520 through the data lines D and D#. In a write (program) operation, the transfer signal TRAN is made to have H-level to turn on the NMOS transistors Q42 and Q42# and take write data stored in the latch circuit LA50 of the shift register 520 in the latch circuit LA40 through the data lines D and D#. Subsequently, the power source of the latch circuit LA40 is switched from Vcc to a higher voltage Vprog and a write control signal W is made to have H-level to turn on the NMOS transistor Q40, thereby controlling the threshold voltage Vth of the memory cell CELL that is subjected to the write operation with specified voltages applied across the word line WL and the bit line BL connected to the memory cell CELL.

However, in the above prior art flash memory, the data read from the memory cell CELL is once held in the latch circuit LA40 of the memory array section 501 and thereafter transferred to the shift register 520 of the peripheral circuit section 502. The write data loaded in the shift register 520 is once stored in the latch circuit LA40 and thereafter written into the memory cell CELL. The latch circuit LA40 always intervenes in the read operation and the write operation, and this disadvantageously leads to an enormous loss in terms of access time and consumption power.

SUMMARY OF THE INVENTION

The object of the present invention is therefore to provide a serial access system semiconductor storage device capable of reducing the access time and decreasing the consumption current.

In order to achieve the aforementioned object, the present invention provides a serial access system semiconductor storage device comprising:

a memory cell array including a plurality of memory cells; and a shift register which has a plurality of latch circuits connected in series and operates in a read operation to once hold data received from the memory cell array via a bit line in the latch circuits and serially outputs the held data in order in which the latch circuits are arranged, wherein at least one of the latch circuits of the shift register sense-amplifies the data stored in the memory cells inside the memory cell array.

In the serial access system semiconductor storage device of the present invention, at least one of the latch circuits constituting the shift register directly sense-amplifies the data stored in the memory cell inside the memory cell array in the read operation. Further, in the write operation, the write data loaded on the latch circuits of the shift register are directly written into the memory cells inside the memory cell array not by way of the other latch circuit. With this arrangement, the access time is reduced and the consumption power is decreased as compared with the prior art (the case where a latch circuit intervenes between a memory cell array and a shift register).

In this serial access system semiconductor storage device, the latch circuit interposed between the memory cell array and the shift register is eliminated, and therefore, the layout area is reduced.

In an embodiment, only a specified latch circuit out of the latch circuits inside the shift register sense-amplifies the data stored in the memory cells inside the memory cell array.

According to this embodiment, in the read operation, the specified latch circuit inside the shift register sense-amplifies the data stored in the memory cells inside the memory cell array and once holds the data. Subsequently, the data is transferred to the latch circuit adjacent to the specified latch circuit inside the shift register. Then, the specified latch circuit sense-amplifies the data stored in other memory cells inside the memory cell array and once holds the data. As described above, the data stored in the memory cells inside the memory cell array can be successively sense-amplified and read by the specified latch circuit while being sequentially transferred between the adjacent latch circuits inside the shift register.

In this serial access system semiconductor storage device, the latch circuit which executes the sense-amplifying inside the shift register is limited to the specified one. Therefore, when adding a boosting-use element for executing the sense-amplifying to the latch circuit, the number of the latch circuits to which such an element is added can be reduced. According to this, the layout area is reduced.

In an embodiment, the memory cells inside the memory cell array are divided in groups, each group including a specified number of the memory cells, the number of the shift registers corresponds to the number of memory cells included in each of the groups, and the shift registers sequentially operate such that the data stored in the memory cells included in each of the groups are sequentially sense-amplified in correspondence with addresses in each of the groups.

In this embodiment, the plurality of shift registers operate in parallel with a time shift in the read operation and the write operation. Therefore, the access time is further reduced.

An embodiment further comprises, a write circuit which receives the data stored in the latch circuits of the shift registers in a write operation and applies a voltage corresponding to the data to the bit line so that the data are stored in the memory cells inside the memory cell array.

In this embodiment, a necessary write voltage (program voltage) can be applied to the memory cells inside the memory cell array by the write circuit according to the data loaded in the latch circuit of the shift register in the write operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The serial access system semiconductor storage device of the present invention will be described in detail below on the basis of the embodiments thereof.

Figure 1:
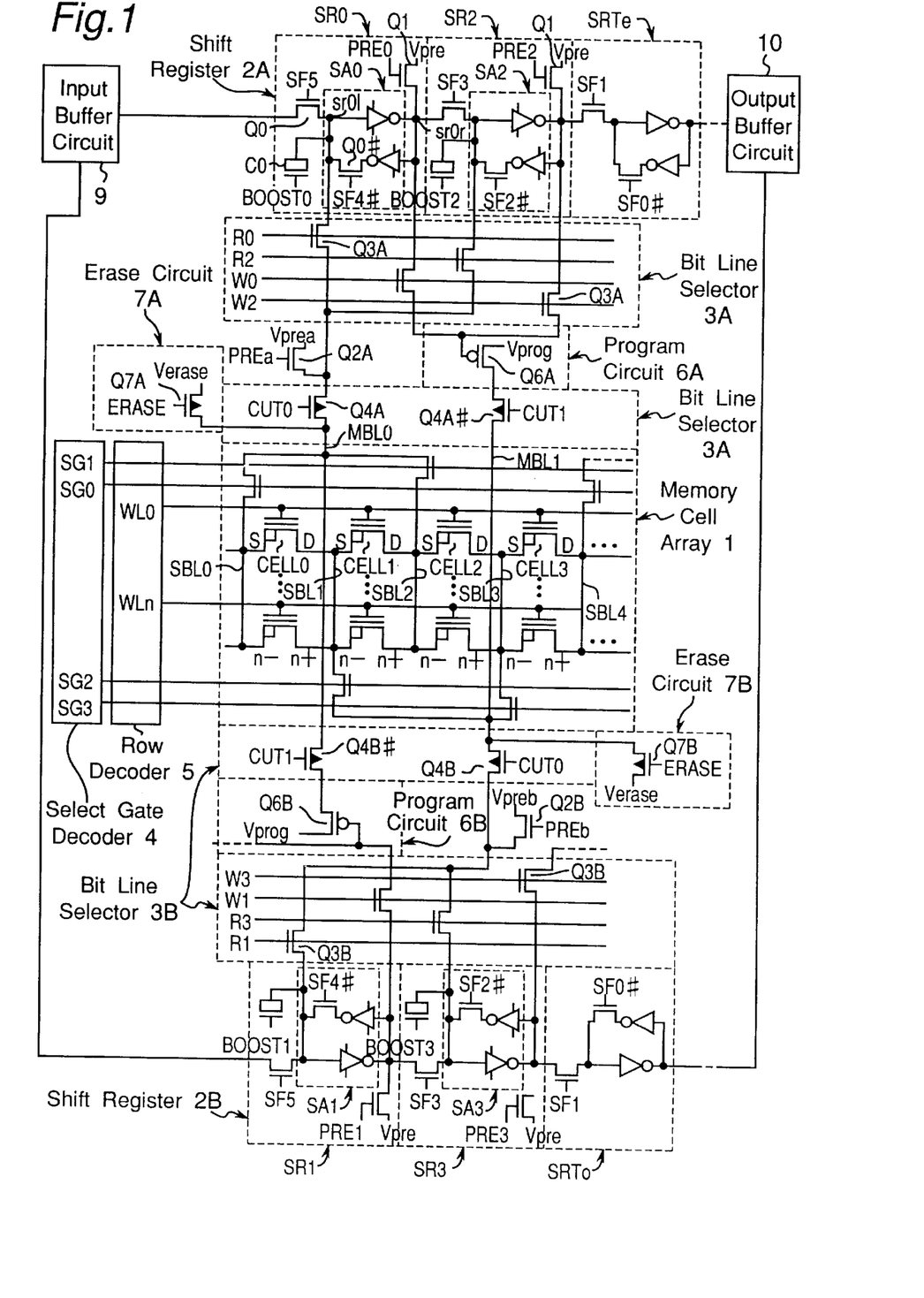
FIG. 1 is a diagram schematically showing structure of a flash memory according to an embodiment of the present invention.

FIG. 1 schematically shows the structure of a flash memory according to an embodiment of the present invention. This flash memory (electrically collectively erasable programmable read-only memory) is provided with a memory cell array 1 in which memory cells CELL (individually specified by being denoted by the numbers of 0, 1, 2, 3, . . . ) are arranged in a matrix form, shift registers 2A and 2B provided on both sides of this memory cell array 1, bit line selectors 3A and 3B, a select gate decoder 4, a row decoder 5, program circuits 6A and 6B which serve as write circuits, erase circuits 7A and 7B, an input buffer 9 and an output buffer 10.

Each memory cell CELL of the memory cell array 1 of this example is constructed of a floating-gate type transistor (flash memory cell) having a drain region ($n^+$ diffusion region) D having a high impurity concentration and a source region ($n^-$ diffusion region) S having a low impurity concentration, the regions formed inside a triple well ($p^-$ well formed inside an $n^-$ well formed in a p-type silicon substrate). The drain region D and the source region S of each memory cell CELL serve as virtual ground system sub-bit lines SBL (individually specified by being denoted by the numbers of 0, 1, 2, 3, . . . ) The two sub-bit lines SBL are subjected to selection by select gate control signals SG0, SG1, SG2 and SG3 formed by the select gate decoder 4 so as to be connected to one main bit line MBL (individually specified by being denoted by the numbers of 0, 1, . . . ). It is to be noted that only one block of the memory cell array 1 is illustrated in FIG. 1 and the other plurality of blocks arranged in the vertical direction are not shown. The one block is herein defined as a range which covers the connection between word lines WL0 . . . , WLn with the commonly-used sub-bit line SBL.

Figure 8:
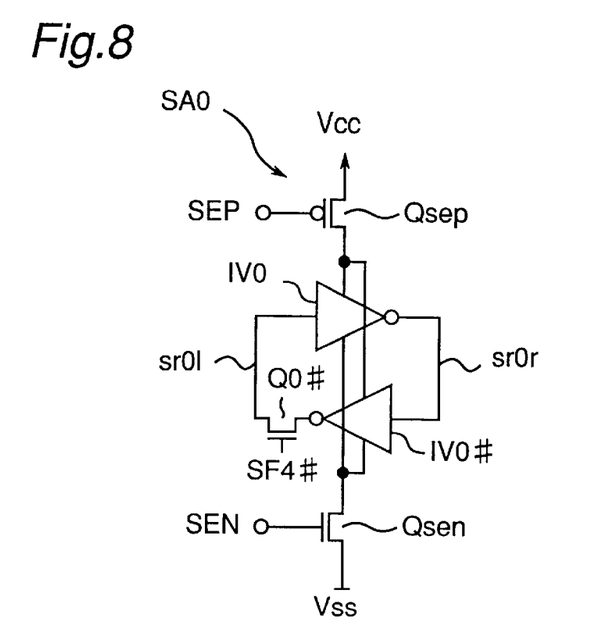
FIG. 8 is a diagram showing an example of constitution of a latch circuit for operating as a sense amplifier.

The shift register 2A has a plurality of latch circuits SR0, SR2, . . . including latch sections SA0, SA2, . . . , respectively. As shown in FIG. 8 (exemplifying the latch section SA0), each of the latch sections SA0, SA2, . . . has a CMOS inverter IV0, a CMOS inverter IV0# and an NMOS transistor Q0# connected in a loop form. A PMOS transistor Qsep which is controlled to be turned on and off by a pull-up signal SEP is inserted between the inverters IV0 and IV0# and a power source (voltage Vcc), while an NMOS transistor Qsen which is controlled to be turned on and off by a pull-down signal SEN is inserted between the inverters IV0 and IV0# and the ground (voltage Vss). By turning on these transistors Qsep and Qsen (which may be commonly used by a plurality of latch sections), each of the latch sections SA0, SA2, . . . differentially amplifies a potential difference between a sense node (connection point of the transistor Q0# and the inverter IV0) srO1 and a sense node (connection point of the inverter IV0 and the inverter IV0#) srOr. As shown in FIG. 1, the latch sections SA0, SA2, . . . are sequentially connected in series via an NMOS transistor Q0 at the sense nodes srO1 and srOr. The NMOS transistors Q0 and Q0# are controlled to be turned on and off by the shift register control signals SF1, SF3, . . . and SF0#, SF2#, . . . , respectively. It is acceptable to connect a PMOS transistor which is controlled to be turned on and off by signals obtained by inverting these shift register control signals in parallel with the NMOS transistors Q0 and Q0#, thereby improving the electric characteristics of the shift register in a shift operation. To the one sense node srO1 of the latch sections SA0, SA2, . . . is connected a capacitor C0 for supplying boost signals BOOST0, BOOST1, . . . for the purpose of infallibly executing the differential amplification. To the other sense node (output node) srOr of the latch sections SA0, SA2, . . . is connected an NMOS transistor Q1 which is controlled to be turned on and off by a pre-charge signal PRE (individually specified by being denoted by the numbers 0, 1, . . . ) for supplying a pre-charge voltage Vpre.

In a symmetrical manner to the shift register 2A, the shift register 2B has a plurality of latch circuits SR1, SR3, . . . including latch sections SA1, SA3, . . . , respectively. The shift register 2A is used for even-number addresses with its constituent elements individually specified by being denoted by the even numbers 0, 2, . . . , while the shift register 2B is used for odd-number addresses with its constituent elements individually specified by being denoted by the odd numbers 1, 3, . . .

A bit line selector 3A has a plurality of NMOS transistors Q3A which are controlled to be turned on and off by read control signals R0 and R2 or write control signals W0 and W2 as well as NMOS transistors (formed inside the triple well) Q4A and Q4A# which are connected respectively to main bit lines MBL0 and MBL1 and controlled to be turned on and off by bit line cut signals CUT0 and CUT1, respectively. In a similar manner, the bit line selector 3B has a plurality of NMOS transistors Q3B which are controlled to be turned on and off by read control signals R1 and R3 or write control signals W1 and W3 as well as NMOS transistors (formed inside the triple well) Q4B# and Q4B which are connected respectively to the main bit lines MBL0 and MBL1 and controlled to be turned on and off by bit line cut signals CUT1 and CUT0, respectively.

Figure 3:
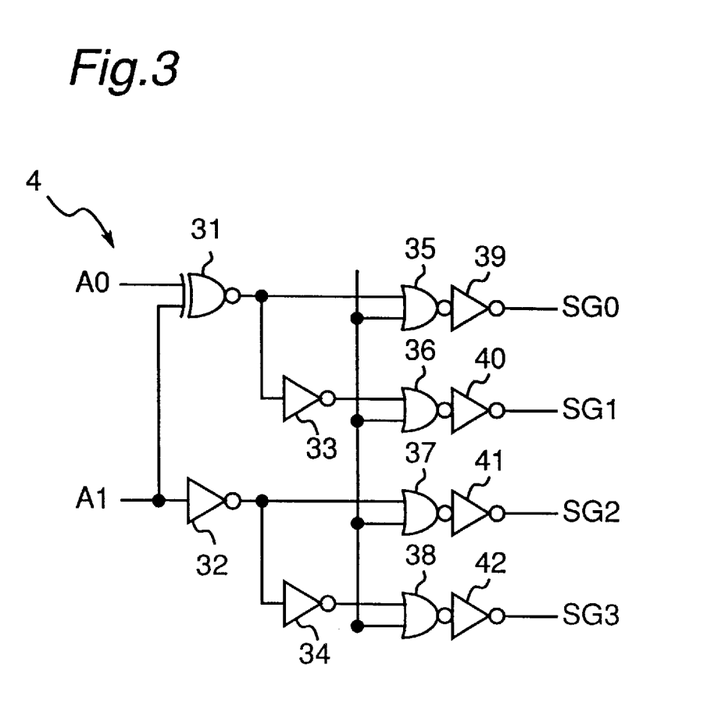
FIG. 3 is a diagram showing an example of constitution of a select gate decoder of the above flash memory.

As shown in FIG. 3, the select gate decoder 4 is constructed of an XNOR (exclusive negative logical sum) circuit 31, NOT (negative) circuits 32, 33 and 34, NOR (negative logical sum) circuits 35, 36, 37 and 38 and NOT circuits 39, 40, 41 and 42. Then, the decoder 4 decodes address signals A0 and A1 and outputs select gate control signals SG0, SG1, SG2 and SG3 as shown in the logic table of Table 1.

TABLE 1

| A0 | 0 | 1 | 0 | 1 |
|---|---|---|---|---|
| A1 | 0 | 0 | 1 | 1 |
| SG0 | 1 | 0 | 0 | 1 |
| SG1 | 0 | 1 | 1 | 0 |
| SG2 | 1 | 1 | 0 | 0 |
| SG3 | 0 | 0 | 1 | 1 |

The NMOS transistors Q2A and Q2B are controlled to be turned on and off respectively by pre-charge signals PREa and PREb in order to supply pre-charge voltages Vprea and Vpreb to the main bit lines MBL0 and MBL1. It is to be noted that the pre-charge voltages Vprea and Vpreb are individually set equal to either Vpre or Vss by a pre-charge voltage selecting means (not shown).

The program circuits 6A and 6B have PMOS transistors Q6A and Q6B for supplying the program voltage Vprog to the main bit line MBL1 and MBL0, respectively. The gate of the PMOS transistor Q6A is connected to the output nodes srOr, . . . of the latch circuits SR0, SR2, . . . of the shift register 2A via the bit line selector 3A. In a similar manner, the gate of the PMOS transistor Q6B is connected to the output nodes of the latch circuits SR1, SR3, . . . of the shift register 2B via the bit line selector 3B. In the write operation, the output node of either the shift register 2A or 2B is made to have a continuity to the gate of the PMOS transistors Q6A and Q6B by the operations of the bit line selectors 3A and 3B, and according to the data held by the output nodes srOr, . . . (the output node voltage has H-level when the data is 0, and the output node voltage has L-level when the data is 1), these PMOS transistors Q6A and Q6B are controlled to be turned on or off.

The erase circuits 7A and 7B have NMOS transistors (formed inside the triple well) Q7A and Q7B which are controlled to be turned on and off by an erase signal ERASE for supplying an erase voltage Verase to the main bit lines MBL0 and MBL1, respectively.

Figure 10:
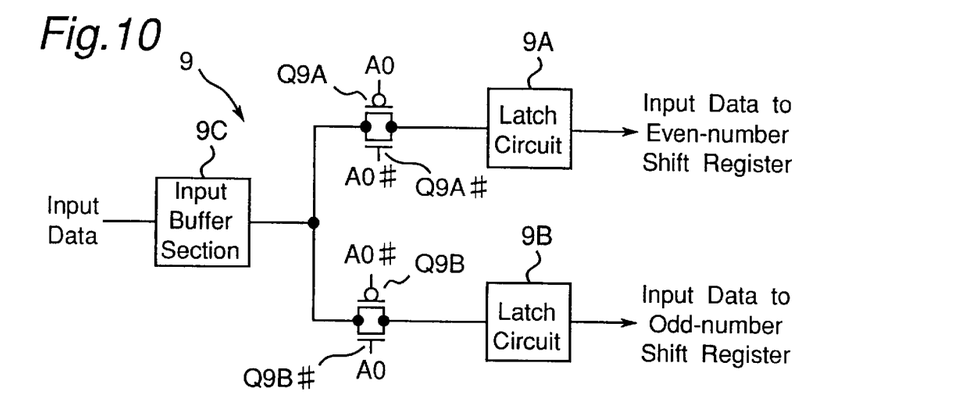
FIG. 10 is a diagram showing block constitution of an input buffer circuit of the flash memories shown in FIGS. 1, 4 and 5.

As shown in FIG. 10, the input buffer circuit 9 has an input buffer section (normal input buffer) 9C for receiving input data, a latch circuit 9A which is connected to the output side of this input buffer section 9C via a pair of a PMOS transistor Q9A and an NMOS transistor Q9A# which are connected in parallel with each other and a latch circuit 9B which is connected to the output side of the input buffer section 9C via a pair of a PMOS transistor Q9B and an NMOS transistor Q9B# which are connected in parallel with each other. The transistors Q9A, Q9A#, Q9B and Q9B# are controlled to be turned on and off by address signals A0, A0#, A0# and A0 (A0 and A0# are complementary signals) respectively, so that the output (write data) of the input buffer section 9C is demultiplexed. The latch circuits 9A and 9B receive the distributed data, hold the data once and output the data to the even-number address shift register 2A and the odd-number address shift register 2B, respectively. Therefore, the write data can be loaded in the shift registers 2A and 2B at a higher speed than in the case where only one line of shift register is provided.

Figure 9:
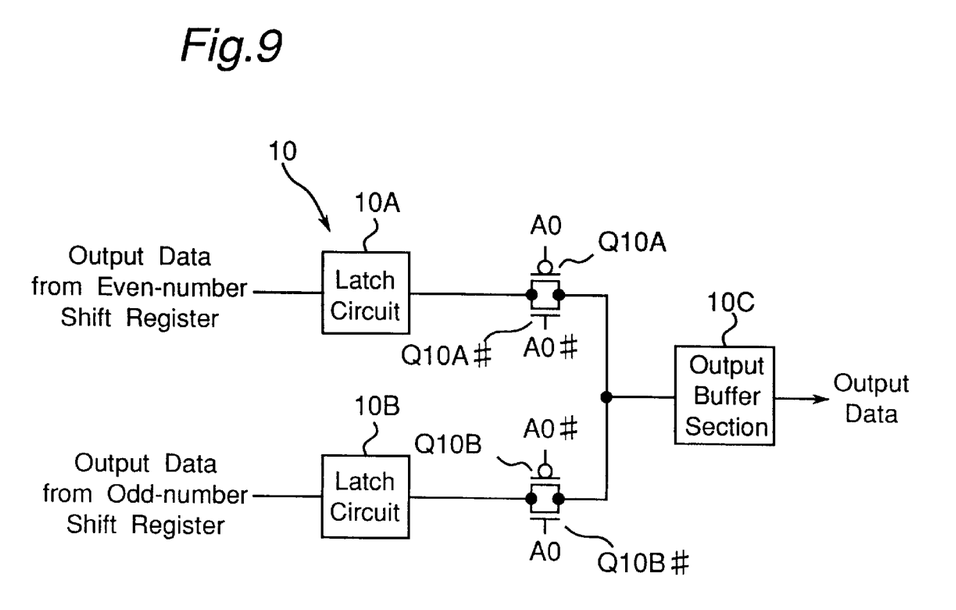
FIG. 9 is a diagram showing block constitution of an output buffer circuit of the flash memories shown in FIGS. 1, 4 and 5.

As shown in FIG. 9, the output buffer circuit 10 has a latch circuit 10A which receives output data from the even-number address shift register 2A and holds the data once, a latch circuit 10B which receives output data from the odd-number address shift register 2B and holds the data once and an output buffer section (normal output buffer) 10C. The output buffer section 10C is connected to the output side of the latch circuit 10A via a parallel connection of a PMOS transistor Q10A and an NMOS transistor QL0A# and connected to the output side of the latch circuit 10B via a parallel connection of a PMOS transistor Q10B and an NMOS transistor Q10B#. The transistors Q10A, Q10A#, Q10B and Q10B# are controlled to be turned on and off by the address signals A0, A0#, A0# and A0 (A0 and A0# are complementary signals) respectively, so that the outputs of the latch circuits 10A and 10B are multiplexed. Therefore, the data transferred at high speed by the two lines of the shift registers 2A and 2B can be smoothly serially outputted via the output buffer section 10C.

This serial access system semiconductor storage device executes the read operation, write (program) operation and erase operation as follows.

It is assumed that the power voltage Vcc=3 (V) and the ground voltage (potential) Vss=0 (V), and each signal has the power voltage Vcc at high (H) level and the ground voltage Vss at low (L) level unless a specific explanatory note is provided. It is further postulated that the pre-charge voltage Vpre is 1 (V). As described later, the program voltage Vprog is set to +4 (V) in the program operation and to the Vss level in the other states. The erase voltage Verase is set to −8 (V) in the erase operation and to Vss level in the other states. In each of the operations, the word line, bit line on the source region (n⁻ diffusion region) side, the bit line on the drain region (n⁺ diffusion region) side and the well potential are set to the values as shown in Table 2.

TABLE 2

|  | Read operation | Program operation | Erase operation |
|---|---|---|---|
| Word line | +3 V | −8 V | +8 V |
| Bit line on the n⁻ diffusion region side | +1 V | X | −8 V |
| Bit line on the n⁺ diffusion region side | 0 V | +4 V | −8 V |
| Well | 0 V | 0 V | −8 V |

X: arbitrary value (1) Read Operation

During the read operation, for the purpose of securing a data transfer path from the memory cell array 1 to the shift registers 2A and 2B, the NMOS transistors Q4A and Q4B are set to the ON-state with the bit line cut signal CUT0 kept at H-level. On the other hand, the program voltage Vprog, erase voltage Verase, write control signals W0, . . . , W3, bit line cut signal CUT1 and erase signal ERASE are each kept at Vss level. Since the shift registers 2A and 2B are not operated at the start, shift register control signals SFO#, SF2# and SF4# are set to H-level, and shift register control signals SF1, SF3 and SF5 are set to L-level.

First, by selecting a word line by the row decoder 5, an appropriate voltage (3 V in this example) is applied to the specified word line. It is herein assumed that the word line WL0 is selected.

For executing a serial access, data on one word line are all read and transferred to the shift register. Because of the virtual ground system, it is assumed that the reading of all the memory cells CELL connected to one word line is executed in four read operations.

That is, data are first simultaneously read from the memory cell CELL0 and the 4n-th (n=1, 2, . . . ,) memory cell (not shown in FIG. 1) arranged every four cells. The detail is as follows.

(1) For the purpose of selecting sub-bit lines SBL0 and SBL1 and the latch circuit SR0 in the shift register 2A, the select gate control signals SG0 and SG2 and the read control signal R0 are made to have H-level, while the select gate control signals SG1 and SG3 and the read control signals R1, R2 and R3 are made to have L-level. Subsequently, with the pre-charge voltage Vprea set to Vpre and with the pre-charge voltage Vpreb set to Vss by means of a pre-charge voltage selecting means (not shown), the pre-charge signals PREa, PREb and PRE0 are made to have H-level to turn on the NMOS transistors Q2A and Q2B and the NMOS transistor Q1 of the latch circuit SR0. By this operation, the sub-bit line SBL0, the main bit line MBL0 and the sense nodes srO1 and srOr are made to have the pre-charge voltage Vpre, while the sub-bit line SBL1 and the main bit line MBL1 are made to have the ground voltage Vss.

(2) Subsequently, the pre-charge signals PREa and PRE0 are made to have L-level. The sub-bit line SBL0, main bit line MBL0 and sense node srO1, which are pre-charged with the pre-charge voltage Vpre, are not discharged since the memory cell CELL0 is not turned on when the threshold voltage Vth of the memory cell CELL0 is high (this represents data 0). When the threshold voltage Vth of the memory cell CELL0 is low (this represents data 1), they are discharged since the memory cell CELL0 is turned on.

(3) After a lapse of a specified time (this has been set to a time at which (Vpre−ΔV) is achieved after the discharge when the memory cell CELL is in the ON-state), the read control signal R0 is made to have L-level to turn off the NMOS transistors Q3A, thereby disconnecting the main bit line MBL0 and the sense node srO1 from each other. Subsequently, a boost signal BOOST0 is made to have H-level to boost the voltage at the sense node srO1 by ΔV/2 via the capacitor CO. Consequently, if the data in the memory cell CELL0 is 0, the voltage at the sense node srOl becomes (Vpre+ΔV/2) which is higher than the voltage Vpre at the sense node srOr. Conversely when the data in the memory cell CELL0 is 1, the voltage at the sense node srO1 becomes (Vpre−ΔV/2) which is lower than the voltage Vpre at the sense node srOr.

(4) In this case, the latch section SA0 inside the latch circuit SR0 is made to operate as a sense amplifier.

That is, firstly the pull-up signal SEP is made to have L-level and subsequently the pull-down signal SEN is made to have H-level (note that, when (Vpre±ΔV/2) is closer to the power voltage Vcc then the ground voltage Vss, the sensing sensitivity is rather improved by firstly making the pull-down signal SEN have H-level), thereby making the latch section SA0 differentially amplify the potential difference between the sense node srO2 and srOr. By this operation, the data in the latch circuit SR0 is fixed. That is, when the data in the memory cell CELL0 is 0, the sense node srO1 comes to have H-level and the sense node srOr comes to have L-level. When the data in the memory cell CELLO is 1, the sense node srO1 comes to have L-level and the sense node srOr comes to have H-level.

By executing the above operations (1) through (4) on the CELL1 through CELL3 (and the memory cells arranged every four cells), the data in all the memory cells CELL connected to the word line WL0 are alternately transferred to the shift registers 2A and 2B.

Subsequently, by repetitively giving the shift register control signals SF0#, SF1, SF2#, SF3, SF4# and SF5 in accordance with the timing shown in FIG. 2, the data in the shift registers 2A and 2B are successively transferred to the output buffer circuit 10. Then, the data are multiplexed through the output buffer circuit 10 and serially outputted at high speed. Thus the read operation is completed.

(2) Write (program) Operation

During the write (program) operation, the NMOS transistors Q4A# and Q4B# are set to ON-state with the bit line cut signal CUT1 kept at H-level so that the program voltage Vprog can be supplied to the main bit lines MBL1 and MBL0. On the other hand, the bit line cut signal CUT0, erase signal ERASE and erase voltage Verase are each kept at Vss level. The program voltage Vprog is set to Vss level at the start.

Figure 2:
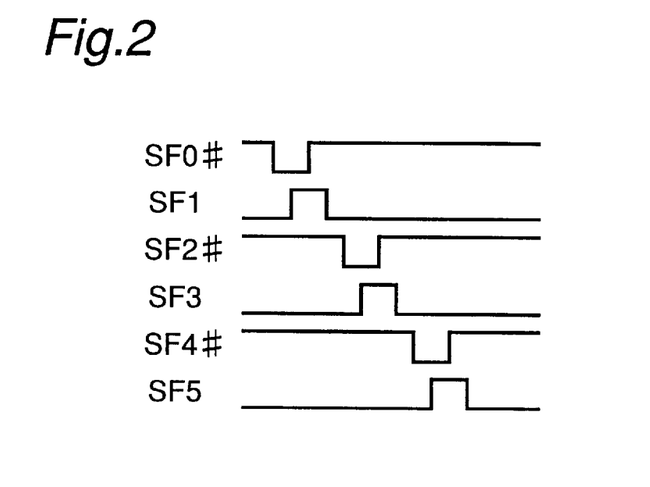
FIG. 2 is a chart showing generating timing of a select gate selection signal for a shift register of the above flash memory.

First, by repetitively giving the shift register control signals SFO#, SF1, SF2#, SF3, SF4# and SF5 in accordance with the timing shown in FIG. 2, the write data (input data) are successively loaded in the shift registers 2A and 2B from the input buffer circuit 9.

It is assumed that the data are written into, for example, the memory cells CELL0 and CELL1 after all the write data are loaded in the shift registers 2A and 2B. In this case, the write control signals W0 and W1 and the select gate control signals SG1 and SG2 are each made to have H-level, while the write control signals W2 and W3 and the select gate control signals SG0 and SG3 are each made to have L-level.

In this case, when the data held in the latch circuit SR0 is 0, i.e., when the voltage at the output node srOr has H-level, the PMOS transistor Q6A is not turned on. When the data held in the latch circuit SR0 is 1, i.e., when the voltage at the sense node srOr has L-level, the PMOS transistor Q6A is turned on.

In this case, when the program voltage Vprog is set to an appropriate voltage (+4 V in this example), the voltage Vprog=+4 V is applied only to the drain region (n$^+$ diffusion region) D side of the memory cell CELL into which the data 1 is to be written, and the drain region (n$^+$ diffusion region) D of the memory cell CELL into which the data 0 is to be written enters into a floating state. Further, when a constant negative pulse voltage (−8 V in this example) is applied to the word line WL0, a high electric field is effected between the floating gate and the drain region D of the memory cell CELL into which the data 1 is to be written, so that electrons are discharged from the floating gate to the drain region D, causing the threshold voltage Vth of the memory cell CELL to reduce (to enter into the state of data 1).

A verification operation for checking whether or not the threshold voltage Vth of the memory cell CELL in which the data 1 has been written has actually reduced can be performed by executing the aforementioned read operation. When the threshold voltage Vth of the memory cell CELL has reduced, the latch circuit SR0 is inverted after the read operation, so that the sense node srO1 comes to have L-level and the sense node srOr comes to have H-level. Consequently, the PMOS transistor Q6A is turned off and then the program voltage Vprog is not applied to the memory cell CELL.

The memory cells CELL2 and CELL3 are subjected to operations similar to those of the memory cells CELL0 and CELL1. In this case, the write control signals W0 and W1 and the select gate control signals SG1 and SG2 are each made to have L-level, while the write control signals W2 and W3 and the select gate control signals SG0 and SG3 are each made to have H-level (in the decoding by the select gate decoder 4, the address signal A0 is fixed to 1 and only the address signal A1 is varied in Table 1).

As described above, all the write data loaded in the shift registers 2A and 2B can be written into the memory cells CELL0, . . .

(3) Erase Operation

In this flash memory, the erase operation means the operation of collectively erasing the data (to make the data 0) of all the memory cells CELL selected by the sub-bit line.

First, a negative voltage is given to the bit line cut signals CUT0 and CUT1, thereby disconnecting the main bit line MBL from the shift registers 2A and 2B and the program circuits 6A and 6B. The select gate control signals SG0, SG1, SG2 and SG3 are made to be selected with the ground voltage Vss, and the select gates of the other blocks (not shown in FIG. 1 because of repetition) are made to be non-selected with the negative voltage.

Next, the erase signal ERASE is set to L-level to turn on the NMOS transistors Q7A and Q7B, and the erase voltage Verase and the well of the memory cell are set to a negative voltage (−8 V in this example). Subsequently, a positive voltage (+8 V in this example) is applied to all the word lines WL0, . . . , WLn connected to the memory cells CELL which commonly owns the sub-bit line SBL. A high electric field is effected between the floating gates, wells, source region S and the drain region D of the memory cells CELL, so that electrons are infused from the well side to the floating gate, causing the threshold voltage Vth of the memory cells CELL to increase (to make the data all 0).

A verification operation for checking whether or not the data in the memory cells CELL are actually erased can be performed by executing the aforementioned read operation. Then, the erase operation will be executed until the data in all the memory cells CELL become 0.

As described above, in this flash memory, the latch circuits SR0, . . . constituting the shift registers 2A and 2B directly sense-amplify the data stored in the memory cell CELL inside the memory cell array 1 in the read operation. In the write operation, the write data loaded in the latch circuit SR0, . . . of the shift registers 2A and 2B can be directly written into the memory cells CELL inside the memory cell array 1 not by way of any latch circuit. With this arrangement, the access time can be reduced and the consumption power can be decreased as compared with the prior art (the case where the latch circuit intervenes between the memory cell array and the shift register). Further, since the latch circuit between the memory cell array 1 and the shift registers 2A and 2B is eliminated, the layout area can be reduced.

Figure 4:
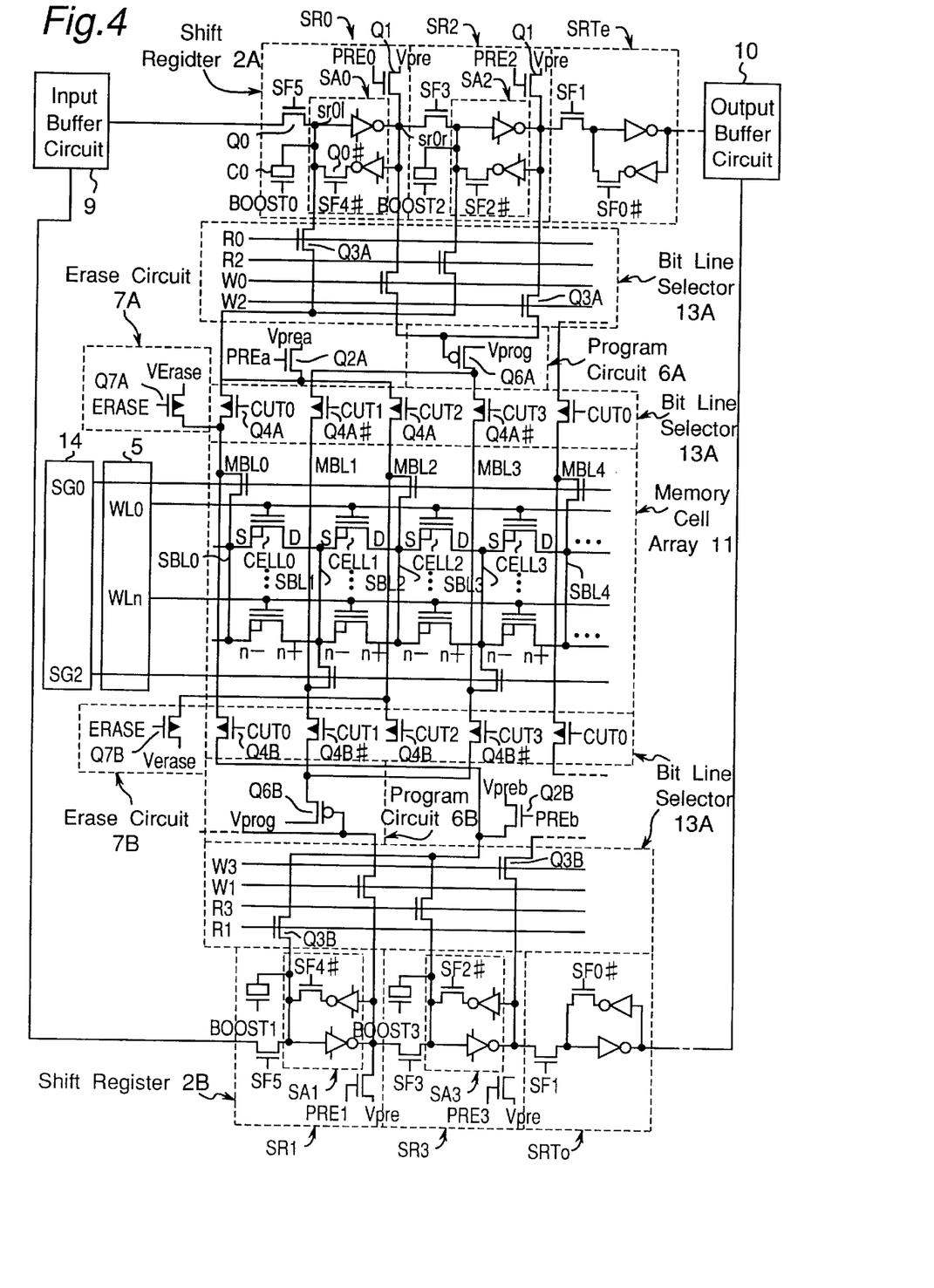
FIG. 4 is a diagram showing a modification example of the flash memory shown in FIG. 1.

Although this flash memory is provided with the three-phase clock shift registers 2A and 2B, the number of phases of the clock is not limited to three, and another number of phases can also be adopted according to the number of the latch circuits SR0, FIG. 4 shows a modification example of the flash memory shown in FIG. 1. It is to be noted that the same components as those shown in FIG. 1 are denoted by the same reference numerals for the sake of simplicity in understanding. This flash memory, which is different from the flash memory shown in FIG. 1, is provided with a memory cell array 11 having main bit lines MBL0, MBL1, . . . equal in number to the sub-bit lines SBL0, SBL1, . . . In accordance with this, the select gate control signals SG1 and SG3 are eliminated from the select gate decoder 14, and instead of this arrangement, bit line cut signals CUT2 and CUT3 are additionally provided. Bit line selectors 13A and 13B are provided with NMOS transistors Q4A, Q4A#, Q4A, Q4A#, . . . which are controlled to be turned on and off by the bit line cut signals CUT0, CUT1, CUT2 and CUT3, respectively. Although the bit lines MBL and SBL are selected by the select gate control signals SG0, SG1, SG2 and SG3 in the flash memory shown in FIG. 1, the bit line MBL is selected by the bit line cut signals CUT0, CUT2, CUT1 and CUT3 in this flash memory. The other portions operate similar to the flash memory shown in FIG. 1.

Figure 5:
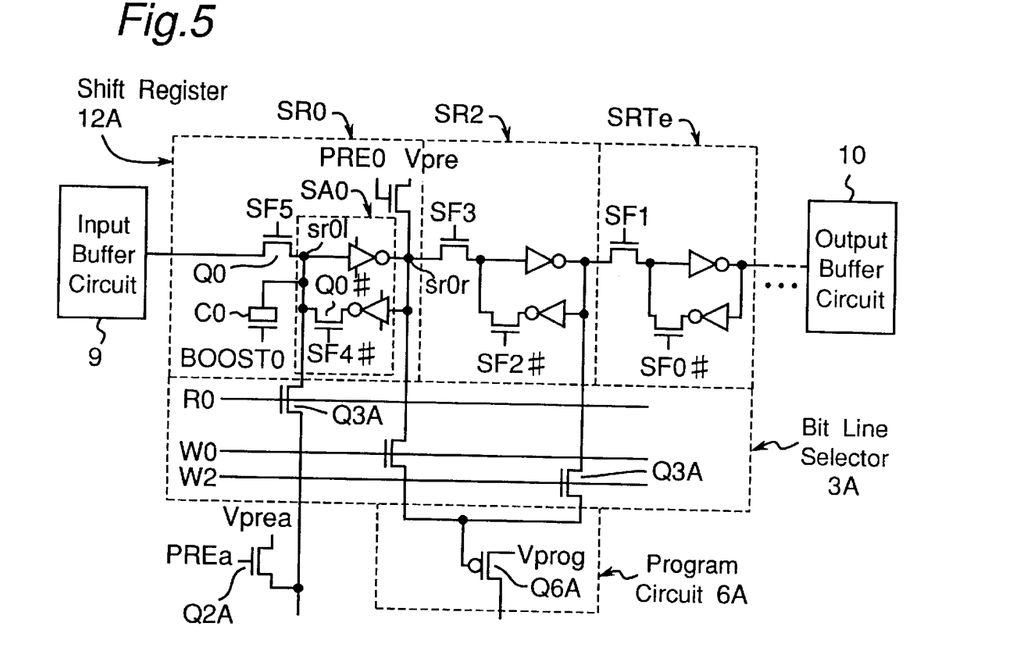
FIG. 5 is a diagram showing a modification example of the peripheries of the shift register of the flash memory shown in FIG. 1.

FIG. 5 shows a modification example of the peripheries of the shift register of the flash memory shown in FIG. 1 (or FIG. 4). In this flash memory, the boosting capacitors C0 of the latch circuit SR2 inside the shift register 2A and the latch circuit SR3 inside the shift register 2B (the shift register 2B on the odd-number address side are not shown because it is symmetrical to the shift register 2A on the even-number address side) are eliminated, so that only the specified latch circuits SR0 and SR1 inside the shift registers 2A and 2B operate as sense amplifiers.

In this flash memory, firstly the latch circuits SR0 and SR1 sense-amplify the data in the memory cells CELL2 and CELL3, respectively and hold the data once in the read operation. Subsequently, only the shift register control signals SF2# and SF3 are changed as shown in FIG. 2, and the data held in the latch circuits SR0 and SR1 are transferred (shifted) to the latch circuits SR2 and SR3, respectively. Subsequently, the latch circuits SR0 and SR1 sense-amplify the data in the memory cells CELL0 and CELL1 and hold the data once. As described above, the data stored in the memory cells CELL can be successively sense-amplified by the specified latch circuits SR0 and SR1 while successively transferring the data between adjacent latch circuits inside the shift registers 2A and 2B, allowing the reading to be achieved. It is to be noted that the write (program) operation and the erase operation are executed similar to those of the flash memory shown in FIG. 1.

According to this flash memory, the number of the capacitors C0 can be further reduced and the constitution of the latch circuits SR2 and SR3 are simplified as compared with the flash memory shown in FIG. 1, so that the layout area can be reduced.

Figure 6A:
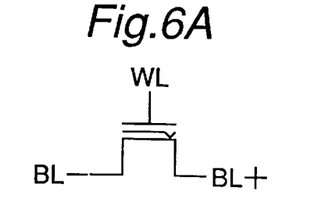
FIGS. 6A through 6E are diagrams showing examples of memory cells which can be used in the flash memories shown in FIGS. 1 and 4.
Figure 6B:
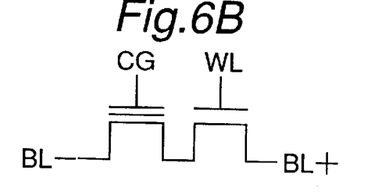
Figure 6C:
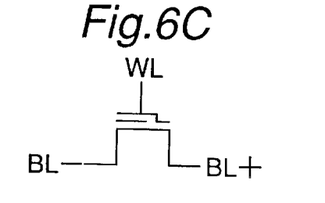
Figure 6D:
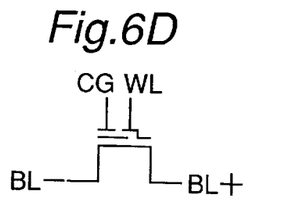
Figure 6E:
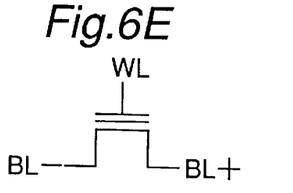

Although the memory cell CELL is a flash memory cell having the drain region D and the source region S having different impurity concentrations, the present invention is of course not limited to it. The memory cell CELL may be a FLOTOX (Floating Gate With Tunnel Oxide) type flash memory as shown in FIG. 6A, a variety of split gate type flash memories as shown in FIGS. 6B, 6C and 6D, or an ETOX (EEPROM With Tunnel Oxide) type flash memory as shown in FIG. 6E.

Although the memory cell arrays 1 and 11 are virtual ground system ones, the present invention can also be applied to a memory cell array of the normal NOR (negative logical sum) type, AND (logical product) type, NAND (negative logical product) type or the like.

Figure 7:
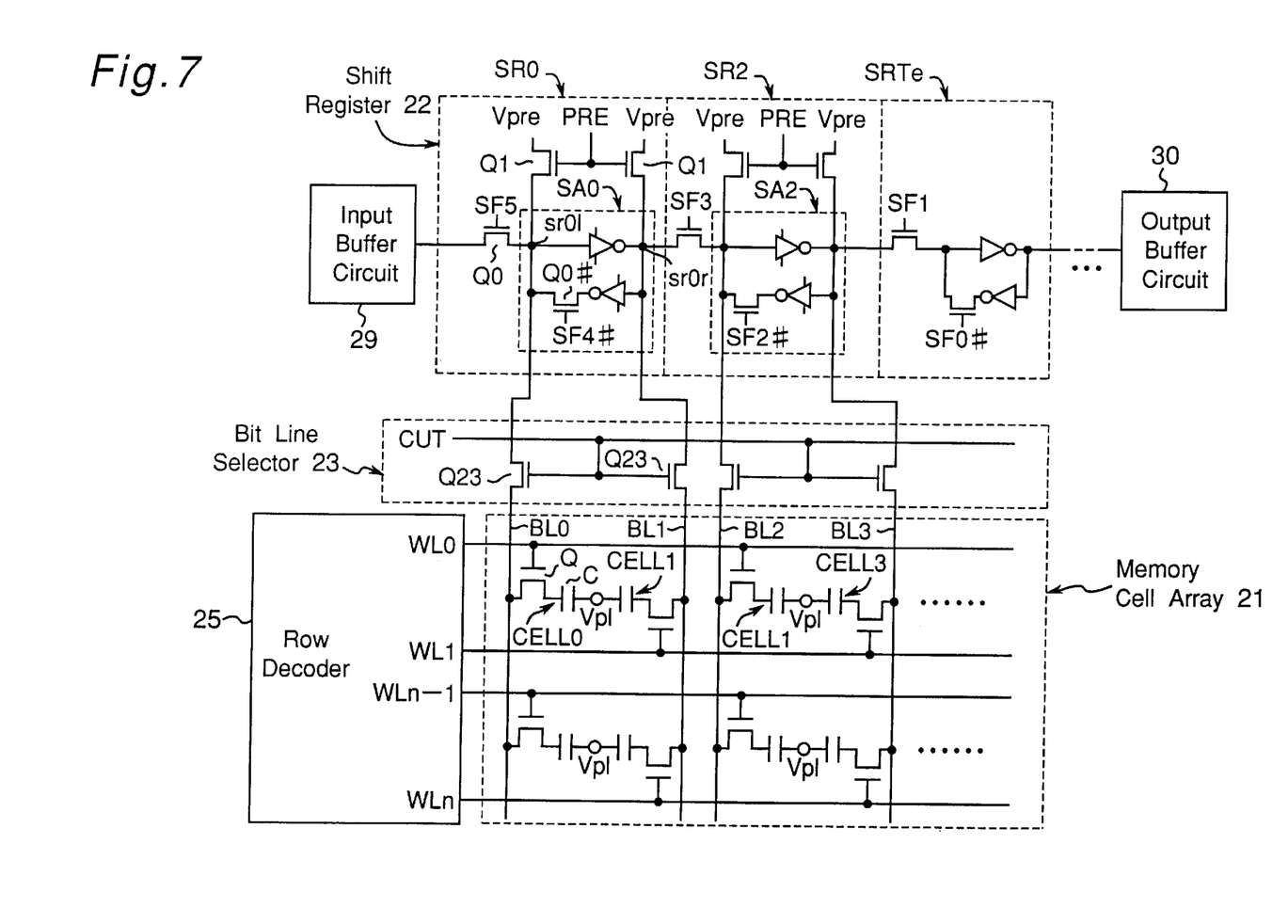
FIG. 7 is a diagram schematically showing structure of a DRAM according to another embodiment of the present invention.

Further, the present invention can also be applied to a DRAM (dynamic type semiconductor storage device) as shown in FIG. 7. This DRAM is provided with a memory cell array 21 in which one-transistor one-capacitor type memory cells CELL (individually specified by being denoted by the numbers 0, 1, 2, 3, . . . ) each constructed of a transistor Q and a capacitor C are arranged in a matrix form, a shift register 22, a bit line selector 23, a row decoder 25, an input buffer 29 and an output buffer 30. Memory cells CELL which are adjacent to each other in the direction of the row inside the memory cell array 21 are constructed as a pair of two cells (as a pair of CELL0 and CELL1, a pair of CELL2 and CELL3, . . . ) The capacitors C of a pair of memory cells have their one ends connected to each other, and a plate voltage Vp1 (=Vcc/2) is supplied to the connection point. For example, the even-number memory cells CELL0, CELL2, . . . are connected to one word line WL0, and the odd-number memory cells CELL1, CELL3, . . . are connected to the word line WL1 adjacent to the word line. A shift register 22A is obtained by eliminating the boosting capacitor C0 of the shift register 2A shown in FIG. 1 and connecting an NMOS transistor Q1 which is controlled to be turned on and off by the pre-charge signal PRE for supplying a pre-charge voltage Vpre (=Vcc/2) to each of the sense nodes srO1 and srOr. A bit line selector 23 is inserted in the bit lines BL0, BL1, BL2, BL3, . . . and includes a plurality of NMOS transistors Q23, Q23, which are controlled to be turned on and off by the bit line cut signal CUT.

In the write operation, firstly by repetitively giving the shift register control signals SFO#, SF1, SF2#, SF3, SF4# and SF5 in accordance with the timing shown in FIG. 2, the write data (input data) are successively loaded from an input buffer circuit 29 into the shift register 22. After all the write data have been loaded in the shift register 22, the bit line cut signal CUT is made to rise to turn on the NMOS transistors Q23, Q23, . . . , thereby fixing the level (H or L) of each bit line pair (a pair of BL0 and BL1, a pair of BL2 and BL3, . . . ) according to the data held in the latch circuits SR0, SR1, . . . When writing data into, for example, the even-number memory cells CELL0, CELL2, . . . , the word line WL0 is made to rise and then fall after a lapse of a specified time. When writing data into the odd-number memory cells CELL1, CELL3, . . . , the word line WL1 is made to rise and then fall after a lapse of a specified time. By this operation, the data can be written into the memory cell connected to the word line.

In the read operation, the bit line cut signal CUT is made to rise to turn on the NMOS transistors Q23, Q23, . . . and the pre-charge signal PRE is made to rise to turn on the NMOS transistor Q1, thereby supplying the pre-charge voltage Vpre to the bit lines BL0, BL1, BL2, BL3, . . . After the bit lines have been pre-charged, only the pre-charge signal PRE is made to fall. When reading data from, for example, the even-number memory cells CELL0, CELL2, . . . , the word line WL0 is made to rise. When reading data from the odd-number memory cells CELL1, CELL3, . . . the word line WL1 is made to rise. Then, the bit line cut signal CUT is made to fall after a lapse of a specified time, thereby turning off the NMOS transistors Q23, Q23, . . . By this operation, the bit lines BL0, BL1, BL2, BL3, . . . are separated from the latch circuits SR0, SR2, . . . of the shift register 22. In this state, the latch circuits SR0, SR2, . . . are made to operate, thereby differentially amplifying (sense-amplifying) the infinitesimal potential difference between the sense nodes srO1 and srOr. After the potentials at the sense nodes srO1 and srOr are fixed, by repetitively giving the shift register control signals SF0#, SF1, SF2#, SF3, SF4# and SF5 in accordance with the timing shown in FIG. 2, the data in the shift register 22 are successively transferred to the output buffer 30, thereby completing the read operation.

The present invention can also be applied to other semiconductor storage devices such as SRAM (static type semiconductor storage device). In DRAM, SRAM or the like, the write operation is only required to input the output of the shift register to the memory cells no matter whether the data is 0 or 1. Therefore, neither the program circuit nor the erase circuit as shown in FIG. 1 are required to be provided.

As apparent from above, in the serial access system semiconductor storage device of the present invention, the latch circuit constituting the shift register directly sense-amplifies the data stored in the memory cell inside the memory cell array in the read operation. Therefore, the access time can be reduced as compared with the prior art (the case where a latch circuit intervenes between a memory cell array and a shift register). The consumption power can be also decreased. Further, according to this serial access system semiconductor storage device, the latch circuit interposed between the memory cell array and the shift register is eliminated, and therefore, the layout area can be reduced.

In an embodiment, the latch circuit which executes sense-amplifying inside the shift register is limited to the specified one. Therefore, when adding a boosting-use element for executing the sense-amplifying to the latch circuit, the number of the latch circuits to which such an element is added can be reduced. According to this, the layout area can be reduced.

In the serial access system semiconductor storage device of an embodiment, the plurality of shift registers operate in parallel with a time shift in the read operation and the write operation. Therefore, the access time can be further reduced.

In the serial access system semiconductor storage device of an embodiment, the necessary write voltage (program voltage) can be applied to the memory cells inside the memory cell array by the write circuit according to the data loaded in the latch circuit of the shift register in the write operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A serial access system semiconductor storage device comprising:

a memory cell array including a plurality of memory cells; and a shift register which has a plurality of latch circuits connected in series and operates in a read operation to once hold data received from the memory cell array via a bit line in the latch circuits and serially outputs the held data in order in which the latch circuits are arranged, wherein at least one of the latch circuits of the shift register sense-amplifies the data stored in the memory cells inside the memory cell array.

2. A serial access system semiconductor storage device as claimed in claim 1, wherein only a specified latch circuit out of the latch circuits inside the shift register sense-amplifies the data stored in the memory cells inside the memory cell array.

3. A serial access system semiconductor storage device as claimed in claim 1, wherein the memory cells inside the memory cell array are divided in groups, each group including a specified number of the memory cells, the number of the shift registers corresponds to the number of memory cells included in each of the groups, and the shift registers sequentially operate such that the data stored in the memory cells included in each of the groups are sequentially sense-amplified in correspondence with addresses in each of the groups.

4. A serial access system semiconductor storage device as claimed in claim 1, further comprising a write circuit which receives the data stored in the latch circuits of the shift registers in a write operation and applies a voltage corresponding to the data to the bit line so that the data are stored in the memory cells inside the memory cell array.

* * * * *